United States Patent
Humphreys

(10) Patent No.: US 6,724,265 B2
(45) Date of Patent: Apr. 20, 2004

(54) COMPENSATION FOR OSCILLATOR TUNING GAIN VARIATIONS IN FREQUENCY SYNTHESIZERS

(75) Inventor: Scott Robert Humphreys, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/172,627

(22) Filed: Jun. 14, 2002

(65) Prior Publication Data

US 2003/0231068 A1 Dec. 18, 2003

(51) Int. Cl.$^7$ ................................................ H03L 7/00
(52) U.S. Cl. .......................... 331/17; 331/16; 327/105; 332/128
(58) Field of Search ............................... 331/17, 16, 14, 331/70, 177 R, 175, 176, DIG. 2; 327/156, 157, 105–106; 375/371–376; 332/100, 128, 127, 126

(56) References Cited

U.S. PATENT DOCUMENTS

| | | | | |
|---|---|---|---|---|
| 4,602,222 A | | 7/1986 | Wynn | 606/105 |
| 4,743,867 A | * | 5/1988 | Smith | 332/127 |
| 4,893,087 A | | 1/1990 | Davis | 327/106 |
| 5,021,754 A | * | 6/1991 | Shepherd et al. | 332/128 |
| 5,079,522 A | | 1/1992 | Owen et al. | 331/16 |
| 5,130,676 A | * | 7/1992 | Mutz | 332/100 |
| 5,983,077 A | * | 11/1999 | Dent | 455/44 |
| 6,008,703 A | | 12/1999 | Perrott et al. | 332/100 |
| 6,211,747 B1 | | 4/2001 | Trichet et al. | 332/128 |

OTHER PUBLICATIONS

Gardner, Floyd M., "Charge–Pump Phase–Lock Loops," IEEE Transactions on Communications, vol. COM–28, No. 11, Nov. 1980, pp. 1849–1858.
Gray, Paul R. and Meyer, Robert G., "Analysis and Design of Analog Integrated Circuits," Third Edition, John Wiley & Sons, Inc., 1977, 1984, 1993, Section A4.2, pp. 322–333.
"Digital Cellular Telecommunications System (Phase 2+); Radio Transmission and Reception (GSM 05.05 version 8.5.1 Release 1999)," GSM Global System For Mobile Communications, European Telecommunications Standards Institute, 2000, document No. ETSI EN 300 910.
Perrott, Michael H., "A 27–mW CMOS Fractional–N Synthesizer Using Digital Compensation for 2.5–Mb/s GFSK Modulation," IEEE Journal of Solid–Sate Circuits, vol. 32, No. 12, Dec. 1997, pp. 2048–2060.

* cited by examiner

Primary Examiner—Minh Nguyen
(74) Attorney, Agent, or Firm—Withrow & Terranova, PLLC

(57) ABSTRACT

A system is provided for compensating for tuning gain variations in a phase lock loop. Compensation is performed by a calibration system that estimates the tuning gain of the oscillator and then adjusts the charge pump current value by a ratio of the nominal tuning gain to the measured tun gain. The tuning gain measurement is performed by measuring the change in the voltage controlled oscillator's tuning control voltage when the phase lock loop is locked to two different frequencies, which are separated by a fixed, predetermined amount. The two frequencies may be above or below the final output frequency of the VCO, or the second frequency may be the final frequency in order to reduce calibration time and settling time.

28 Claims, 3 Drawing Sheets

COMPENSATION FOR OSCILLATOR TUNING GAIN VARIATIONS IN FREQUENCY SYNTHESIZERS

FIELD OF THE INVENTION

The present invention relates in general to frequency synthesizers, and in particular, to a technique to compensate for tuning gain variations.

BACKGROUND OF THE INVENTION

With reference to FIG. 1, an exemplary fractional-N frequency synthesizer 12 is illustrated according to one embodiment of the present invention. The synthesizer 12 includes a fractional-N phase lock loop (PLL) 14, and generates a desired frequency for the output signal, $F_{VCO}$, 16, of a voltage controlled oscillator (VCO) 18. In traditional fashion, the output signal $F_{VCO}$ 16 is also provided to divider circuitry 20 to divide the output signal $F_{VCO}$ by a factor N to produce a divided VCO signal $F_V$, which is fed to one of two inputs of a phase detector 22.

A reference signal, $F_{REF}$, is divided by a factor R in divider circuitry 24 to produce a divided reference signal, $F_r$, which is provided to the other input of the phase detector 22. The N and R factors are selected so that the frequencies of the divided reference signal, $F_r$, and the divided VCO signal, $F_V$ are equal when the desired output signal, $F_{VCO}$, 16, is at a desired frequency. The phase detector 22 compares the relative phases of the divided reference signal, $F_r$, and the divided VCO signal, $F_V$, and provides an output relative to the difference in phase to drive a charge pump 26.

The phase detector 22 is typically an asynchronous digital logic circuit that pulses either pump up (PU) or pump down (PD) signals for the duration of time between rising edges on the reference signal, $F_r$, and divided VCO signal, $F_V$. The PU and PD signals cause the charge pump 26 to source or sink current, ICP, from a low pass filter, generally referred to as the loop filter 28. The loop filter 28 is typically a passive or active RC filter, and the one or more pulses of current are integrated and stored on the loop filter's capacitors as charge. The output voltage of the loop filter 28 is a function of this charge, and acts as the tuning control voltage $V_{CON}$ of the VCO 18. The N divider circuitry 20 is typically a programmable integer or fractional divider, which is used to set the output frequency of the VCO 18. The PLL 14 acts as a feedback control system to drive the phase, and therefore frequency, error of the $F_r$ and $F_v$ signals to zero. Since $F_v = F_{VCO}/N$, where N is the divider modulus, the VCO frequency is set to $F_{VCO} = N\, F_r$.

The behavior of the PLL 14 in terms of noise and dynamic response is determined by the loop gain of the system. The loop gain is given by:

$$G(s) = \frac{I_{CP} K_v F(s)}{sN}, \qquad \text{Eq. 1}$$

where s is the Laplace frequency variable, $I_{CP}$ is the charge pump current in amperes (A), $K_V$ is the tuning gain in cycles-per-second-per-volt (Hz/V), F(s) is the loop filter transfer function, and N is the VCO divider modulus. A typical filter transfer function contains a gain set by a capacitance, or combination of capacitances, an integration function, and a lead-lag pole/zero combination to set the phase margin of the loop:

$$F(s) = \frac{1}{sC} \frac{(s\tau_z + 1)}{(s\tau_p + 1)}. \qquad \text{Eq. 2}$$

The unity loop gain frequency, also referred to as the loop bandwidth, is given by:

$$BW = \sqrt{\frac{I_{CP} K_v K_f}{NC}} \qquad \text{Eq. 3}$$

where the variable, $K_p$, is a factor that depends on the locations of the poles and zeros. Note that the loop bandwidth depends not only on the pole and zero locations, but also on the loop gain constant set by the charge pump current, $I_{CP}$, the loop divider value, the filter capacitance, and the VCO tuning gain.

Modern communication systems, such as the GSM cellular telephone system, impose strict requirements on the locktime and noise performance of the transmitted signal, and on the signals used for mixing in the receiver. For example, the transmit locktime must typically be under 250 μs to settle the VCO to under 100 Hz error, and the transmitted phase noise must be under—113 dBc/Hz at 400 kHz offset. If the loop bandwidth is too wide, the noise performance may not be met, and if the loop bandwidth is too narrow, the locktime may not be met. In addition, the phase error of the transmitted signal must remain small. For example, the phase error of the transmitted signal must be under five degrees rms in a GSM system.

The use of fractional-N synthesis enables digital modulation for phase or frequency based systems and is attractive due to reduced complexity of the transmit system relative to traditional analog modulation techniques. However, variations in loop gain, and thus bandwidth, can degrade the performance of fractional-N based transmit systems in which a fixed predistortion filter is used to compensate for the rolloff of the loop responses. Mismatch between the expected and actual loop response degrades the phase error of the transmitted signal. Simulations indicate that the loop gain must be accurate to within 15% of the expected nominal value for a 120 kHz loop bandwidth and fixed predistortion filter for less than 5 degrees rms phase error.

While the pole and zero locations, which depend on RC time constants, and the charge pump current, $I_{CP}$, and loop divider variations can be compensated by methods known in the prior art, the VCO tuning gain, $K_V$, poses a more difficult problem. The tuning gain, $K_V$, of the VCO 18 characterizes the sensitivity of the VCO output frequency, $F_{VCO}$, to changes in its tuning control voltage, $V_{CON}$. The tuning gain, $K_V$, is defined as:

$$K_v \equiv \frac{dF_{VCO}}{dV_c}. \qquad \text{Eq. 4}$$

The tuning gain, $K_V$, is usually not constant, and for an integrated, wide-range VCO, the tuning gain can vary as much as three to one over the desired tuning range.

Although methods of 'flattening' the variation in the tuning gain curve have been advanced, these methods typically require more complex tuning methods employing additional circuit elements. It is desirable to avoid any additional cost or complexity in the VCO, since the material cost, noise, and power consumption constraints are usually very tight.

Thus, instead of compensating the VCO 18 directly, the loop gain of the PLL 14 can be compensated by adjusting another gain term. For example, the charge pump current may be modified to compensate for variation in the tuning gain. This requires, first, a method of measuring the tuning gain, and second, a method of applying the appropriate adjustment.

Two methods have traditionally been used to characterize the tuning gain. The first is to measure or characterize the tuning gain of the VCO once and construct a table of tuning gain versus operating frequency, such a method is described in U.S. Pat. No. 4,893,087, issued Jan. 9, 1990, which is incorporated herein by reference. The table is then mapped to an adjustment factor for the charge pump current $I_{CP}$ versus the VCO divider value, and is stored in a non-volatile memory. While the nominal loop gain adjustments may be known for a 'typical' VCO 18, the accuracy of nominal adjustments is not sufficient for high performance communications systems when integrated components with large tolerances are used. Hence, this method has the drawbacks of requiring an extensive one-time measurement process on each product that runs through the factory, and of requiring a non-volatile storage means within each product, which unduly increases costs.

The second method is to indirectly measure the closed loop bandwidth, which depends to a large extent on the loop gain. This type of method typically requires a modulation source to be applied to the VCO 18, and a frequency discriminator to determine the frequency deviation of the VCO 18 while the PLL 14 is locked as noted in U.S. Pat. No. 5,079,522, issued Jan. 7, 1992, which is incorporated herein by reference. If the loop bandwidth is wider than the modulation frequency applied to the VCO 18, the frequency deviation of the VCO 18 will be lower than if the loop bandwidth is narrower than the modulation frequency. A similar method could apply modulation through the loop divider.

In either of the above cases, the allowable deviation may be very small relative to the center frequency of the VCO, requiring a very accurate frequency discriminator or counter. For example, in a GSM cellular phone, the VCO 18 may be running at 1900 MHz, and may have an allowable deviation of only 20 MHz due to tuning voltage constraints. This is a deviation of less than ten percent (10%). In a system employing GMSK modulation through a fractional-N PLL, the GSM rms phase accuracy specification requires that the loop gain must be measured and corrected to within a 15% error, as discussed above. The actual frequency measurement accuracy would need to be 0.15*0.1=0.005=1.5%. This accuracy requires a long calibration time, which may be too long to perform each time the phone switches to a new transmission frequency.

Thus, what is needed is a fast and low complexity calibration technique that provides a desired, arbitrary level of accuracy with minimal overhead in terms of device area and calibration time. The calibration should complete rapidly enough to be performed each time the frequency synthesizer is enabled. The system should also function automatically, with little or no user intervention.

SUMMARY OF THE INVENTION

The present invention provides for compensating for tuning gain variations in a phase-locked loop. Compensation is performed by a calibration system that estimates the tuning gain of the oscillator and then adjusts the charge pump current value by a ratio of the nominal tuning gain to the measured tuning gain. The tuning gain measurement is performed by measuring the change in the voltage controlled oscillator's tuning control voltage when the phase-locked loop is locked to two different frequencies, which are separated by a fixed, predetermined amount. The two frequencies may be above or below the final output frequency of the VCO, or the second frequency may be the final frequency, in order to reduce calibration time and settling time. Use of the system in a fractional-N phase-locked loop takes advantage of the fast locking properties, afforded by the high loop bandwidth and reference frequency such that there is minimal impact to warm-up time for the entire system. The system provides accurate calibration of phase-locked loop gain and bandwidth, which is important to guarantee settling time, noise performance, and modulation accuracy.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
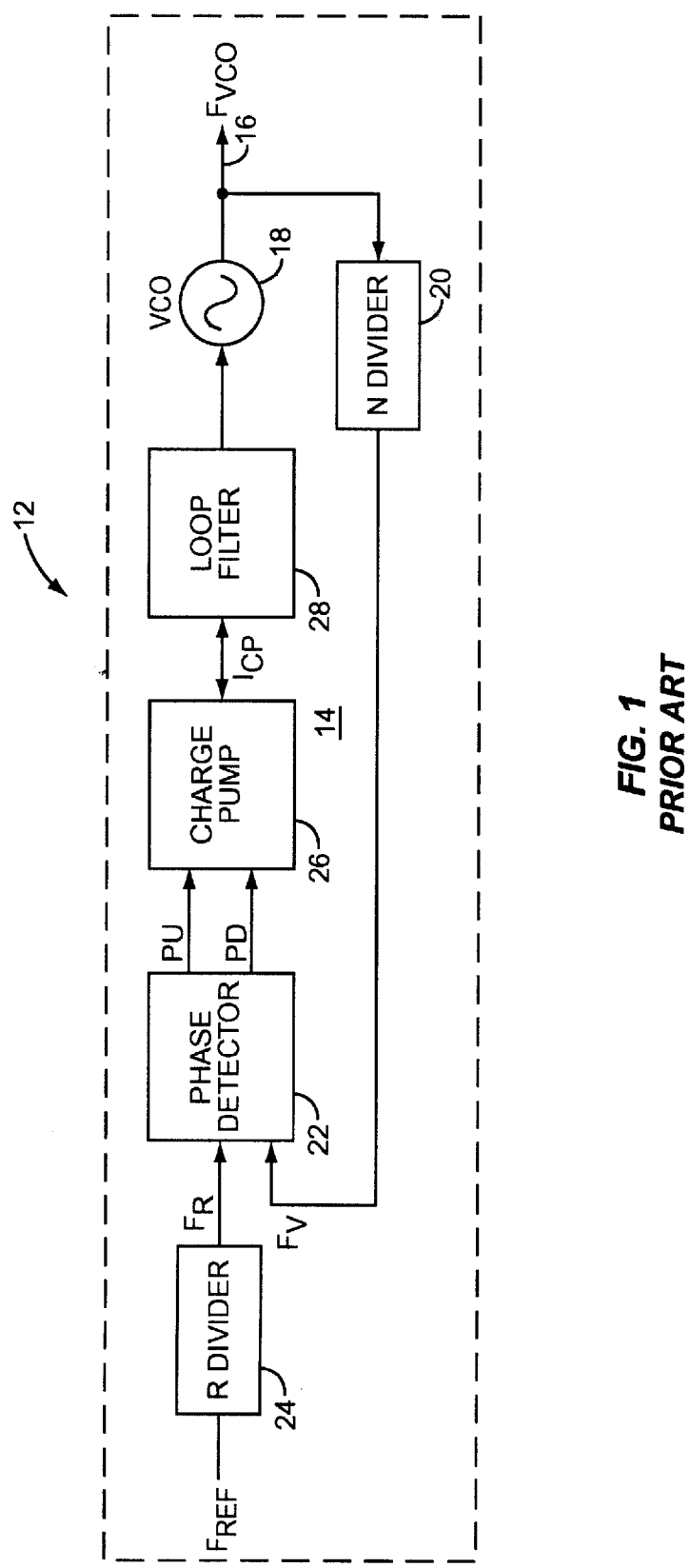
FIG. 1 is a block representation of a frequency synthesizer constructed according to techniques of the prior art.
Figure 2:
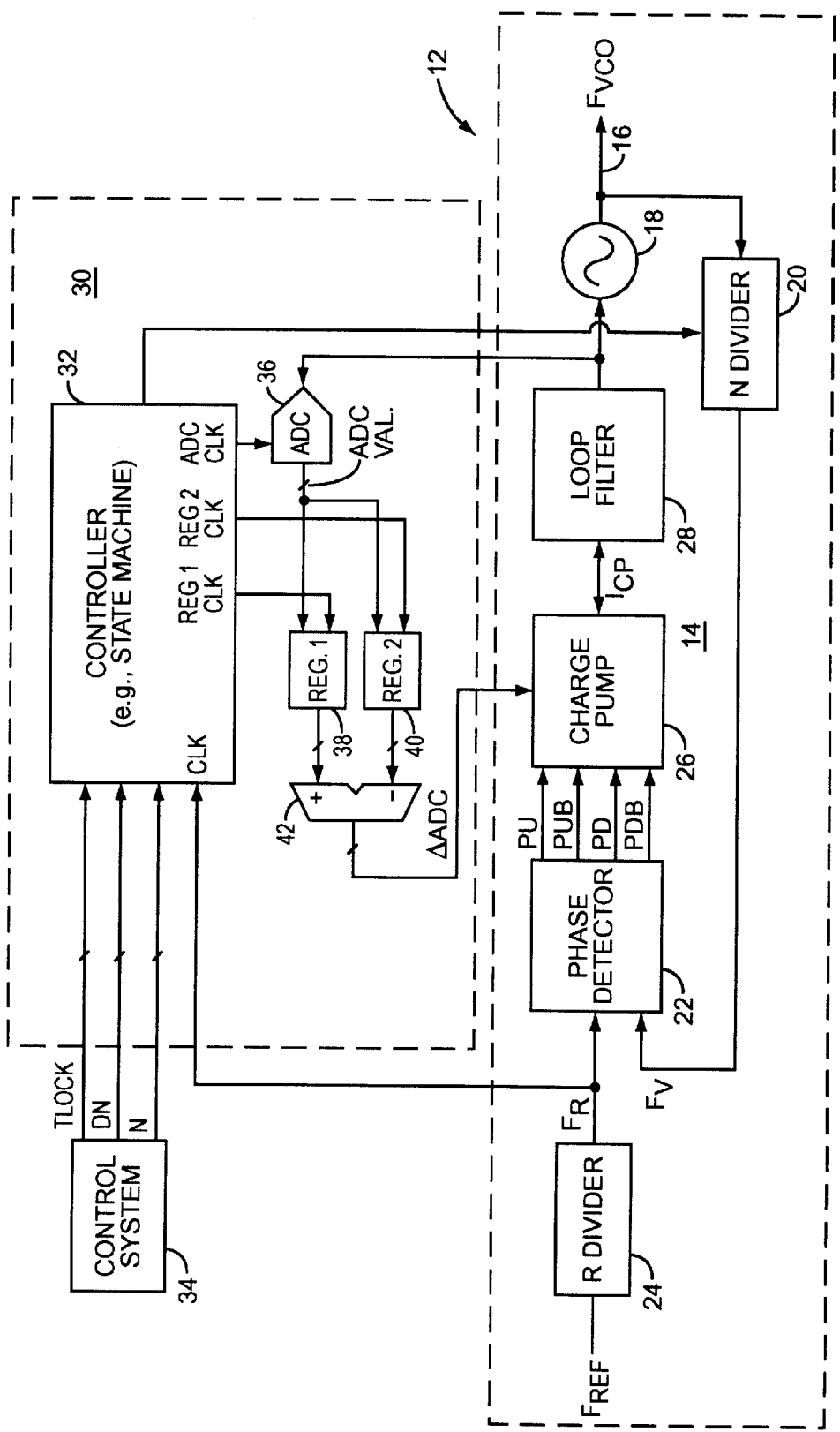
FIG. 2 is a block representation of a frequency synthesizer along with a calibration system constructed according to one embodiment of the present invention.

With reference to FIG. 2, a frequency synthesizer 12 as illustrated in FIG. 1 is associated with a tuning gain calibration system 30. The tuning gain calibration system 30 may be operated under the control of a tuning gain controller 32, which receives instructions from a primary control system 34, such as that controlling operation of a mobile terminal. In one embodiment, the tuning gain calibration system 30 also includes an analog-to-digital converter providing a digital representation of the tuning control voltage, $V_{CON}$, two registers 38, 40 for storing the digital representations of the tuning voltage for different operating frequencies, and subtraction circuitry 42 for subtracting the digital representations of the different tuning control voltages. The output of the subtraction circuitry 42 provides a signal used to control the charge pump 26 to compensate for variations in tuning gain. The details of operation are described below after an overview of the theory supporting the invention.

The tuning gain calibration system 30 approximates the tuning gain of the PLL 14 by measuring the change in tuning control voltage, $V_{CON}$, for a predetermined change in VCO frequency. This approximates the tuning gain with discrete differences:

$$K_v \equiv \frac{dF_{VCO}}{dV_c} \approx \frac{(F_2 - F_1)}{(V_2 - V_1)} = \frac{\Delta F}{\Delta V}. \qquad \text{Eq. 5}$$

The system locks the VCO 18 to two different frequencies near the final, desired frequency. The second frequency may be the final frequency in order to reduce calibration time. A measurement of the tuning control voltage, $V_{CON}$, is made after the PLL 14 has locked to each frequency, and the difference in tuning voltages is calculated.

The ratio of the measured voltage change $\Delta V$ and the expected (nominal) voltage change $\Delta V_o$ is equal to the ratio of the nominal tuning gain $K_{VO}$ to the measured tuning gain $K_V$:

$$K_{vo} = \frac{\Delta F}{\Delta V_o}, K_v = \frac{\Delta F}{\Delta V} \Rightarrow \frac{K_v}{K_{vo}} = \frac{\Delta V_o}{\Delta V}. \qquad \text{Eq. 6}$$

By using an analog-to-digital converter to measure the tuning voltage, the ratio of measured-to-nominal tuning gain can be expressed in digital form:

$$\Delta V = (V_2 - V_1) \propto (ADC_2 - ADC_1) = \Delta ADC, \qquad \text{Eq. 7}$$

where ADC represents the digital output word of the analog-to-digital converter. For the nominal tuning gain, there will be a nominal difference in ADC values, $\Delta ADC_0$. The ratio of the measured to the desired $\Delta ADC$ value is equal to the ratio of the desired to the measured tuning gain:

$$\frac{\Delta V}{\Delta V_o} = \frac{\Delta ADC}{\Delta ADC_o} = \frac{K_{vo}}{K_v}. \qquad \text{Eq. 8}$$

This ratio can be introduced into the loop gain by using it to adjust a switchable current mirror ratio in the charge pump 26:

$$G = \frac{I_{CP}K_v}{NC} = \frac{\left(I_{CP_o}\frac{\Delta ADC}{\Delta ADC_o}\right)K_v}{NC}. \qquad \text{Eq. 9}$$

The effect of the calibration adjustment is illustrated by examining the ratio of the loop gain constant to the desired gain constant:

$$\frac{G}{G_o} = \frac{I_{CP}K_v}{NC} \frac{NC}{I_{CP_o}K_{vo}} = \qquad \text{Eq. 10}$$

$$\frac{\left(I_{CP_o}\frac{\Delta ADC}{\Delta ADC_o}\right)K_v}{I_{CP_o}K_{vo}} = \frac{\left(I_{CP_o}\frac{K_{vo}}{K_v}\right)K_v}{I_{CP_o}K_{vo}} = \frac{I_{CP_o}K_{vo}}{I_{CP_o}K_{vo}} = 1$$

Figure 3:
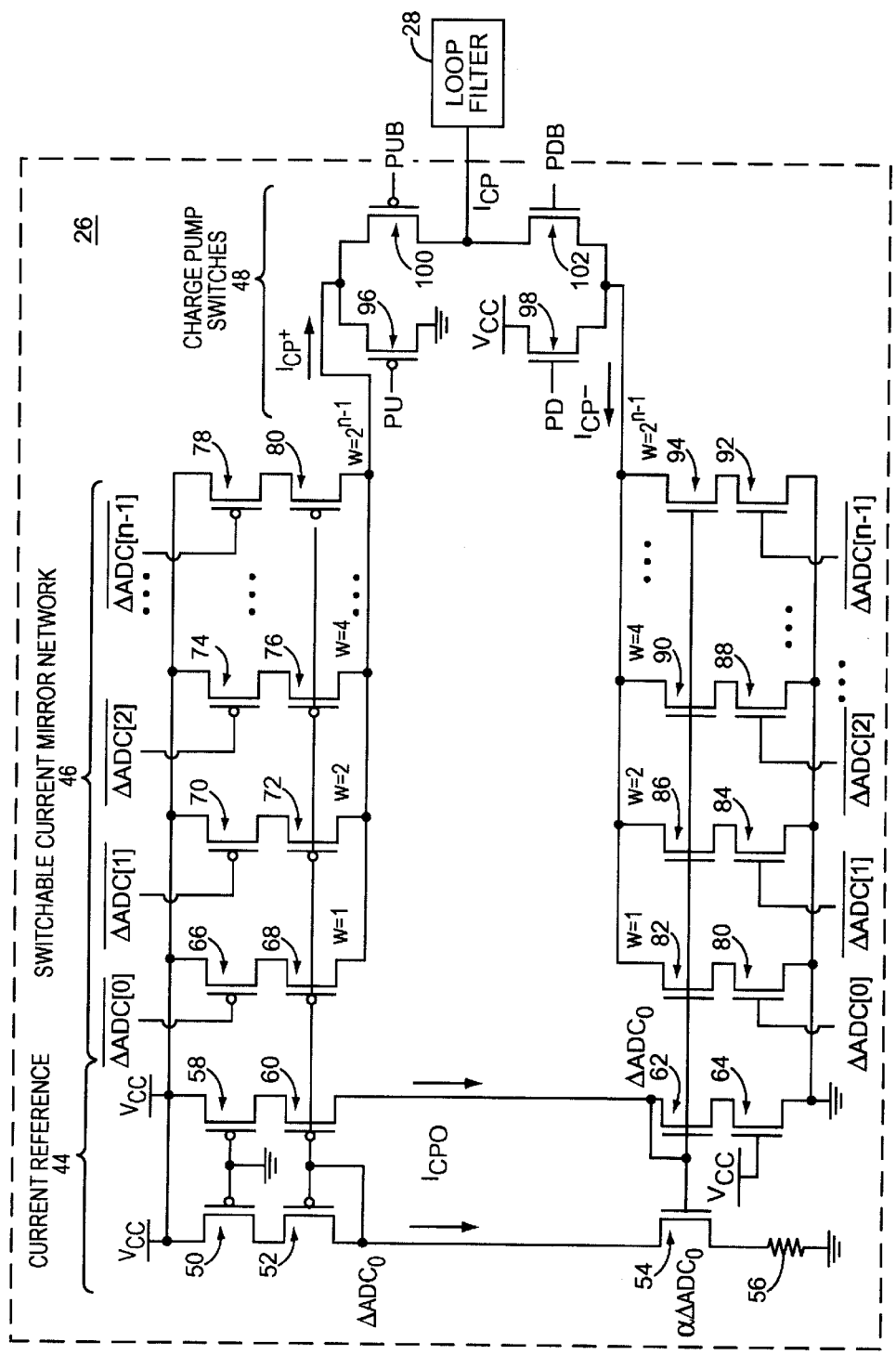
FIG. 3 is a block representation of a charge pump according to one embodiment of the present invention.

This mirror ratio can be implemented in the charge pump 26 illustrated in FIG. 3.

As depicted, the charge pump 26 includes current reference circuitry 44, a switchable current mirror network 46, and a set of charge pump switches 48. The current reference circuitry 44 is used to set a reference charge pump current, $I_{CP0}$, wherein the current flowing from $V_{CC}$ to ground through transistors 50, 52, 54, and resistor 56 is set at a nominal value. This current is mirrored through transistors 58, 60, 62, and 64 to provide a reference for the current mirrors in the switchable current mirror network 46. Those skilled in the art will recognize that a variety of current references may be used, and also that the current reference need not be considered part of the charge pump 26. For example, an integrated circuit may contain a common current reference for all circuits on the integrated circuit, and the charge pump may only receive one or two reference current signals that are coupled to one or more diode connected transistors, similar to transistors 52 and 62, and then mirrored through the switchable current mirror network 46.

The transistors 66–80 establish a series of current mirrors capable of sourcing current, $I_{CP}+$ to the charge pump switches 48 and on to the loop filter 28 based on the digital value for $\Delta ADC$. Each bit in the digital value for $\Delta ADC$ is represented as $\Delta ADC[0]$ through $\Delta ADC[n-1]$. The bar over each of the individual digital signals for $\Delta ADC$ represents the necessary logic level to turn on the P channel FET transistors 66, 70, 74, and 78. Transistors 68, 72, 76, and 80 are turned on via the current reference 44. Thus, the current mirrors on the upper half of the illustration combine to form the sourcing current $I_{CP}+$.

Preferably, the mirror devices, such as transistors 68, 72, 76, and 80, are binary weighted wherein the weights are illustrated as 1, 2, 4, and $2^{n-1}$. The weighting is usually performed by connecting a number of unit cells in parallel, where each unit cell comprises a mirror transistor and a switch transistor. The same transistor device sizes are used in the unit cells for the current reference and mirror devices. As is well known in the art, this technique facilitates inter-digitated or common-centroid layout techniques that improve the accuracy of the current ratios. Thus, the $\Delta ADC$ signal readily selects certain ones of the unit cells in the switchable current mirror network 46 to source charge pump current at a level equal to $(\Delta ADC / \Delta ADC_0) * I_{CP0}$.

For sinking current, the switchable current mirror network 46 includes unit cells formed by transistors 80, 82, 84, 86, 88, 90, 92, and 94. The transistors 82–94 are preferably N-type devices capable of sourcing current, $I_{CP}-$, through selected unit cells based on $\Delta ADC$. Thus, when the charge pump 26 must sink current from the loop filter 28, a readily selectable current value may be sunk into the switchable current mirror network 46.

As illustrated in FIGS. 2 and 3, the phase detector 22 may generate four signals controlling the charge pump, wherein the signals are pump up (PU), pump up bar (PUB), pump down (PD), and pump down bar (PDB). Continuing with reference to FIG. 3, when current must be sourced from the charge pump to the loop filter 28, the logic states for these signals are such that a source charge pump current $I_{CP}+$ is sourced from the switchable current mirror network 46 through transistor 100 and into the loop filter 28. Transistor 96 remains inactive, and transistors 98 and 102 are configured to block current from being sunk into the lower half of the switchable current mirror network 46. Differential current switches consisting of transistors 96 and 100 and transistors 98 and 102 are shown. Alternatively, a single switch connected between the switchable current mirror network and the output may be used. However, as is known in the art, differential switches provide faster switching time by providing a current path to maintain current and bias conditions in the switchable mirror network 46 when the output switch transistor is inactive.

In contrast, the switchable current mirror network 46 may sink current from the loop filter 28 by having the relative signals configured to allow current to flow from the loop filter 28 through transistor 102 and into the lower half of the switchable current mirror network 46. The other transistors 96, 100, and 98 are configured to facilitate such action and block the sourcing of current from the upper portion of the current mirror network 46. Thus, the charge pump switches 48 operate to control the sinking and sourcing of current to and from the loop filter 28. The ΔADC values essentially adjust the magnitude of the current being sunk or sourced. The magnitude of the current being sourced or sunk is directly based on the digital value of the ΔADC signal and the weighting of the corresponding unit cells in the switchable current mirror network 46. Although binary weighting is illustrated, those skilled in the art will recognize various types of weighting, including unitary weighting amongst all unit cells.

In operation, a desired divide-by-N value (N), a divider adjustment value (DN), and a wait time, represented by a number of cycles (TLOCK) of $F_r$, are set or programed by the user in the control system 34 and used to load the controller 32, which may be a simple state machine. Next, the PLL 14 and VCO 18 are enabled, and the controller 32 sets N divider circuit 20 to a first value, N-DN, wherein DN may be either positive or negative. The controller 32 waits until the count indicated by TLOCK has elapsed. The voltage tuning control voltage $V_{CON}$ is measured by the analog-to-digital converter 36, which converts the tuning control voltage into a digital output word, which is stored in a first register 38.

Next, the controller 32 sets the N divider circuitry 20 to N to allow the PLL 14 to lock to the final frequency and waits until the TLOCK count has elapsed. The tuning control voltage $V_{CON}$ is again measured by the analog-to-digital converter 36, which provides another digital output word to a second register 40 for storing. The difference between the first and second digital output words from the first and second registers 38, 40 is calculated to determine a difference value, ΔADC. The difference value ΔADC, which is a multi-bit digital word is applied to the charge pump 26 to alter the charge pump current value $I_{CP}$ as discussed above. Accordingly, the tuning control voltage, $V_{CON}$, is monitored at different operating frequencies to determine a supplemental current adjustment for the charge pump 26. The amount of adjustment correlates to the difference in the turning control voltage, $V_{CON}$, at the different operating frequencies. The digital representation of the difference is applied to the switchable current mirror network 46 to set an amount of additional current to sink from or source to the loop filter 28. The normal operation of the phase detector 22 to control the charge pump 26 determines whether the current is sunk or sourced.

In one embodiment, the DN value is chosen to produce the chosen ΔADCo value that is set in the charge pump when the tuning gain is equal to the nominal tuning gain. The mirrors within the current reference circuitry 44 may be made switchable or programmable, but in most applications a fixed value of ΔADCo may be used. The DN value may be chosen according to the relationship, derived from the relationships presented above:

$$DN = \frac{\Delta ADC_o \cdot V_{FS} \cdot K_{vo}}{2^n \cdot F_r}$$

where ΔADCo is the nominal desired difference in ADC measurement values, $V_{FS}$ is the full scale voltage range of the analog-to-digital-converter, $K_{VO}$ is the nominal VCO tuning gain, n is the number of bits in the analog-to-digital converter, and $F_r$ is the PLL reference frequency. The required accuracy (effective number of bits) of the analog-to-digital converter is determined by the minimum ΔADCo value. The calibration accuracy for any situation is found by changing the ΔADC value by one, so the ratio (percentage) error is at most one over the minimum ΔADC value. For example, a (nominal) ΔADCo value of 32 and a minimum ΔADC value of 20 gives approximately 5% accuracy, and is consistent with a nominal tuning gain of 50 MHz/V and a maximum tuning gain of 75 MHz/V, a 26 MHz $F_r$ frequency, a eight-bit analog-to-digital converter 36 with a 2.7V full-scale range, and a 15.8 MHz frequency step between the initial and final VCO lock frequencies. This corresponds to a DN value of approximately 0.608, which can be implemented with a fractional N divider. Note that in this example, a minimum tuning gain of 25 MHz/V will result in a ΔADC value of 64, which is at the limit of the range of a six bit switchable current mirror network (with the addition of a fixed always-on unit cell). For robustness, ΔADC value should probably be clamped at 1 and 64 in case a larger deviation is measured.

The use of the N divider circuitry 20 and the PLL 14 to set the VCO frequency is advantageous because the PLL 14 locks the VCO 18 to:

$$F_{VCO} = NF_r, \qquad \text{Eq. 11}$$

and the change in frequency with DN is proportional to the fixed reference frequency $F_r$:

$$\Delta F = (F_2 - F_1) = NF_r - (N-DN)F_r = DN \cdot F_r. \qquad \text{Eq. 12}$$

Thus, the change in frequency is independent of the actual desired lock frequency. Similarly, by measuring the difference in tuning control voltages, $V_{CON}$, the result is independent of the actual tuning voltage at the lock frequency. In this way the tuning gain calibration system 30 determines the tuning gain at the lock frequency with accuracy independent of the specifics of the VCO voltage or lock frequency.

The calibration will increase the complete settle time of the PLL 14 if it is to be performed each time the PLL 14 is enabled or switched to a new frequency. Use of a high reference frequency $F_r$, such as in WLAN systems or with Fractional-N PLLs can allow wide loop bandwidths and fast settle times. For example, in a GSM/GPRS system a 26 MHz loop reference frequency can be used with a fractional-N PLL with a 120 kHz loop bandwidth. This loop settles to under 100 Hz error in about 50 μs. The loop settles to within the required voltage accuracy for calibration within about 20 μs, which is used to set TLOCK. Hence the complete system settles in about 70 μs, which is more than fast enough for GSM/GPRS applications, which require complete PLL settle times under 150 μs. Note that the PLL 14 is settling during the second tuning voltage measurement interval.

The controller 32 may be a simple state machine and TLOCK counter, which consists of a handful of flip-flops and logic gates, representing a very small overhead to the area and cost of the complete PLL frequency synthesizer when implemented in CMOS.

Those skilled in the art will recognize improvements and modifications to the preferred embodiments of the present invention. All such improvements and modifications are considered within the scope of the concepts disclosed herein and the claims that follow.

What is claimed is:

1. A system for compensating for oscillator tuning gain variations in a phase-locked loop comprising:
   a) an analog-to-digital converter adapted to receive a tuning control voltage provided by a loop filter to drive a voltage controlled oscillator in the phase-locked loop;

b) first and second memory locations associated with the analog-to-digital converter for storing fist and second digital values corresponding to first and second tuning control voltage values;

c) subtraction circuitry associated with the first and second memory locations and adapted to subtract one of the first and second digital values from the other of the first and second digital values to generate a multiple bit difference value; and d) control circuitry adapted to:
   i) set a first divide value for divide circuitry of the phase-locked loop to cause the phase-locked loop to lock to a first frequency;
   ii) trigger the analog-to-digital converter to sample the tuning control voltage to determine the first digital value, which is stored in the first memory location;
   iii) set a second divide value for the divide circuitry of the phase-locked loop to cause the phase-locked loop to lock to a second frequency; and
   iv) trigger the analog-to-digital converter to sample the tuning control voltage to determine the second digital value, which is stored in the second memory location;

wherein the multiple bit difference value is applied to a charge pump driving the loop filter to adjust charge pump current.

2. The system of claim 1 wherein the control circuitry is adapted to operate to effect compensation of the charge pump each time the phase-lock loop is controlled to lock to a different, final operating frequency.

3. The system of claim 1 wherein the second frequency is a final operating frequency.

4. The system of claim 1 wherein the first divide value is offset from the second divide value by a fixed offset regardless of a final operating frequency of the phase-locked loop.

5. The system of claim 1 wherein the charge pump includes a current mirror network comprising a plurality of current mirrors, each of which corresponds to one bit of the multiple bit ,difference value, such that the multiple bit difference value controls which of the plurality of current mirrors are operational.

6. The system of claim 5 wherein the current mirror network includes a section of current mirrors for sourcing currant to the loop filter and a section of current mirrors for sinking current from the loop filter depending on the operation of a phase detector of the phase-locked loop.

7. The system of claim 6 wherein the charge pump comprises current reference circuitry to set the current flowing through the current mirror network.

8. The system of claim 6 wherein the charge pump comprises charge pump switches controlled by the phase detector to control whether the current mirror network sources current to or sinks current from the loop filter.

9. The system of claim 5 wherein the current mirrors are binary weighted, such that the plurality of current mirrors support an exponentially increasing current for sourcing to or sinking from the loop filter.

10. A system for compensating for oscillator tuning gain variations in a phase-locked loop comprising:
a) a phase-locked loop comprising:
   i) a voltage controlled oscillator responsive to a tuning control voltage to provide an output signal;
   ii) divide circuitry adapted to divide the output signal by a factor N to provide a divided output signal;
   iii) a phase detector adapted to compare the divided output signal with a reference signal and provide at least one charge pump control signal;
   iv) a charge pump adapted to receive the charge pump control signal and a multiple bit difference value and provide a loop filter signal for either sourcing current or sinking current, the multiple bit difference value adapted to adjust the loop filter signal to compensate for turning gain variation; and
   v) a loop filter responsive to the loop filter signal to provide the tuning control voltage;

b) compensation circuitry comprising:
   i) an analog-to-digital converter adapted to receive the tuning control voltage provided by the loop filter to drive the voltage controlled oscillator in the phase-locked loop;
   ii) first and second memory locations associated with the analog-to-digital converter for storing first and second digital values corresponding to first and second tuning control voltage values;
   iii) subtraction circuitry associated with the first and second memory locations and adapted to subtract one of the first and second digital values from the other of the first and second digital values to generate the multiple bit difference value; and c) control circuitry adapted to:
   i) set a first divide value for the divide circuitry of the phase-locked loop to cause the phase-locked loop to lock to a first frequency;
   ii) trigger the analog-to-digital converter to sample the tuning control voltage to determine the first digital value, which is stored in the first memory location;
   iii) set a second divide value for the divide circuitry of the phase-locked loop to cause the phase-locked loop to lock to a second frequency; and
   iv) trigger the analog-to-digital converter to sample the tuning control voltage to determine the second digital value, which is stored in the second memory location;

wherein the multiple bit difference value is applied to the charge pump driving the loop filter to adjust charge pump current.

11. The system of claim 10 wherein the control circuitry is adapted to operate to effect compensation of the charge pump each time the phase-locked loop is controlled to lock to a different, final operating frequency.

12. The system of claim 10 wherein the second frequency is a final operating frequency.

13. The system of claim 10 wherein the first divide value is offset from the second divide value by a fixed offset regardless of a final operating frequency of the phase-locked loop.

14. The system of claim 10 wherein the charge pump includes a current mirror network comprising a plurality of current mirrors, each of which corresponds to one bit of the multiple bit difference value, such that the multiple bit difference value controls which of the plurality of current mirrors are operational.

15. The system of claim 14 wherein the current mirror network includes a section of current mirrors for sourcing current to the loop filter and a section of current mirrors for sinking current from the loop filter depending on the operation of the phase detector.

16. The system of claim 15 wherein the charge pump comprises current reference circuitry to set the current flowing through the current mirror network.

17. The system of claim 15 wherein the charge pump comprises charge pump switches controlled by the phase detector to control whether the current mirror network sources current to or sinks current from the loop filter.

18. The system of claim 14 wherein the current mirrors are binary weighted, such that each of the plurality of current mirrors support an exponentially increasing current for sourcing to or sinking from the loop filter.

19. A method for compensating for oscillator tuning gain variations in a phase-locked loop comprising:
   a) setting the phase-locked loop to a first operating frequency;
   b) measuring a first tuning control voltage necessary for the first operating frequency;
   c) setting the phase-locked loop to a second operating frequency;
   d) measuring a second tuning control voltage necessary for the second operating frequency;
   e) determining a change in the first and second tuning control voltages to create a difference value; and
   f) applying the difference value to a charge pump to compensate for tuning gain variations in the phase-locked loop.

20. The method of claim 19 wherein compensation for tuning gain variations take place each time the phase-lock loop is controlled to lock to a different, final operating frequency.

21. The method of claim 19 wherein the second opening frequency is a final operating frequency.

22. The method of claim 19 wherein first operating frequency is offset from the second operating frequency by a fixed offset regardless of a final operating frequency of the phase-locked loop.

23. The method of claim 19 wherein the difference value is a multiple bit difference value aid the charge pump includes a current mirror network comprising a plurality of current mirrors, each of which corresponds to one bit of the multiple bit difference value, such that the multiple bit difference value controls which of the plurality of current mirrors are operational.

24. A system for compensating for oscillator tuning gain variations in a phase-locked loop comprising:
   a) means for setting the phase-locked loop to a first operating frequency and to a second operating frequency;
   b) means for measuring a first tuning control voltage necessary for the first operating frequency and for measuring a second tuning control voltage necessary for the second operating frequency; and
   c) means for determining a change in the first and second tuning control voltages to create a difference value and for applying the difference value to a charge pump to compensate for tuning gain variations in the phase-locked loop.

25. The system of claim 24 wherein compensation for tuning gain variations take place each time the phase-locked loop is controlled to lock to a different, final operating frequency.

26. The system of claim 24 wherein the second operating frequency is a final operating frequency.

27. The system of claim 24 wherein the first operating frequency is offset from the second operating frequency by a fixed offset regardless of a final operating frequency of the phase-locked loop.

28. The system of claim 24 wherein the difference value is a multiple bit difference value and the charge pump includes a current mirror network comprising a plurality of current mirrors, each of which corresponds to one bit of the multiple bit difference value, such that the multiple bit difference value controls which of the plurality of current mirrors are operational.

* * * * *